United States Patent
Sakugawa et al.

(10) Patent No.: US 10,792,784 B2
(45) Date of Patent: Oct. 6, 2020

(54) LEAK CHECKING METHOD, AND COMPUTER-READABLE STORAGE MEDIUM FOR PERFORMING THE LEAK CHECKING METHOD

(71) Applicant: Ebara Corporation, Tokyo (JP)

(72) Inventors: Suguru Sakugawa, Tokyo (JP); Nobuyuki Takahashi, Tokyo (JP); Toru Maruyama, Tokyo (JP)

(73) Assignee: Ebara Corporation, Tokyo (JP)

( * ) Notice: Subject to any disclaimer, the term of this patent is extended or adjusted under 35 U.S.C. 154(b) by 380 days.

(21) Appl. No.: 15/951,745

(22) Filed: Apr. 12, 2018

(65) Prior Publication Data

US 2018/0304434 A1 Oct. 25, 2018

(30) Foreign Application Priority Data

Apr. 21, 2017 (JP) ................. 2017-084224

(51) Int. Cl.
  *B24B 37/005* (2012.01)
  *B24B 49/10* (2006.01)
  (Continued)

(52) U.S. Cl.
  CPC ............ *B24B 37/005* (2013.01); *B24B 37/10* (2013.01); *B24B 37/32* (2013.01); *B24B 49/00* (2013.01);
  (Continued)

(58) Field of Classification Search
  CPC ....... B24B 37/005; B24B 37/10; B24B 37/32; B24B 49/00; B24B 49/08; B24B 49/491;
  (Continued)

(56) References Cited

U.S. PATENT DOCUMENTS 7,465,214 B2 * 12/2008 Togawa ................. B24B 37/30
  451/1
2003/0061865 A1 * 4/2003 Choi ....................... G01M 3/26
  73/49

(Continued)

FOREIGN PATENT DOCUMENTS

JP   2008-137103 A    6/2008
JP   2015-221471 A   12/2015
JP   2017-187311 A   10/2017

*Primary Examiner* — Dung Van Nguyen
(74) *Attorney, Agent, or Firm* — Leydig, Voit & Mayer, Ltd.

(57) ABSTRACT

A leak checking method which is capable of detecting a leak of compressed gas supplied to a polishing head without removing the polishing head from a polishing apparatus is disclosed. The leak checking method includes: supplying a compressed gas into a pressure chamber, which is formed by a membrane of a polishing head, with the membrane placed in contact with a stationary surface; measuring a flow rate of the compressed gas during supplying of the compressed gas into the pressure chamber, while regulating a pressure of the compressed gas by use of a pressure regulator; deciding whether or not the flow rate measured when a variation in the pressure of the compressed gas is within an allowable range of variation, is within a reference range; and generating a leak-detection signal when the flow rate is outside of the reference range.

5 Claims, 7 Drawing Sheets

(51) Int. Cl.
*H01L 21/67* (2006.01)
*H01L 21/683* (2006.01)
*G01M 3/26* (2006.01)
*H01L 21/304* (2006.01)
*B24B 37/10* (2012.01)
*B24B 49/08* (2006.01)
*B24B 49/00* (2012.01)
*B24B 37/32* (2012.01)

(52) U.S. Cl.
CPC .............. *B24B 49/08* (2013.01); *B24B 49/10* (2013.01); *G01M 3/26* (2013.01); *H01L 21/304* (2013.01); *H01L 21/67092* (2013.01); *H01L 21/6838* (2013.01)

(58) Field of Classification Search
CPC .. G01M 3/26; H01L 21/304; H01L 21/67092; H01L 21/6838
See application file for complete search history.

(56) References Cited

U.S. PATENT DOCUMENTS

| | | | | |
|---|---|---|---|---|
| 2005/0260925 | A1* | 11/2005 | Togawa | B24B 49/16 451/8 |
| 2012/0058709 | A1* | 3/2012 | Fukushima | B24B 37/10 451/5 |

* cited by examiner

LEAK CHECKING METHOD, AND COMPUTER-READABLE STORAGE MEDIUM FOR PERFORMING THE LEAK CHECKING METHOD

CROSS REFERENCE TO RELATED APPLICATION

This document claims priority to Japanese Patent Application Number 2017-084224 filed Apr. 21, 2017, the entire contents of which are hereby incorporated by reference.

BACKGROUND

With a recent trend toward higher integration and higher density in semiconductor devices, circuit interconnects become finer and finer and the number of levels in multilayer interconnect is increasing. In the fabrication process of the multilayer interconnect with finer circuit, as the number of interconnect levels increases, film coverage of step geometry (or step coverage) is lowered in thin film formation because surface steps grow while following surface irregularities on a lower layer. Therefore, in order to fabricate the multilayer interconnect, it is necessary to improve the step coverage and planarize the surface. It is also necessary to planarize semiconductor device surfaces so that irregularity steps formed thereon fall within a depth of focus in optical lithography. This is because finer optical lithography entails shallower depth of focus.

Accordingly, the planarization of the semiconductor device surfaces is becoming more important in the fabrication process of the semiconductor devices. Chemical mechanical polishing (CMP) is the most important technique in the surface planarization. This chemical mechanical polishing is a process of polishing a wafer by placing the wafer in sliding contact with a polishing surface of a polishing pad while supplying a polishing liquid containing abrasive grains, such as silica ($SiO_2$), onto the polishing surface.

A polishing apparatus for performing CMP has a polishing table that supports the polishing pad, and a substrate holder for holding the substrate. The substrate holder is also called a top ring or a polishing head. The substrate holder will be hereinafter referred to as a polishing head. When a substrate is polished with use of such a polishing apparatus, the substrate is pressed against a polishing surface of the polishing pad by the polishing head. At this time, the polishing table and the polishing head are moved relative to each other to bring the substrate into sliding contact with the polishing surface, so that the surface of the substrate is polished.

During polishing of the substrate, if a relative pressing force applied between the substrate and the polishing surface of the polishing pad is not uniform over the entirety of the surface of the substrate, insufficient polishing or excessive polishing would occur depending on the pressing force applied to each portion of the substrate. Thus, in order to even the pressing force applied to the substrate, the polishing head has a plurality of pressure chambers for pressing the substrate against the polishing pad, and these pressure chambers are formed by a membrane (or an elastic membrane). The membrane is attached to a head body of the polishing head, and a compressed gas, such as air and nitrogen gas, is individually supplied into each pressure chamber through each of a plurality of pressure regulator. Pressure of compressed gas in the pressure chamber is regulated by the pressure regulator. Such a polishing head having a plurality of pressure chambers can press a plurality of zones of the substrate separately against polishing pad with a desired pressure.

As a number of substrates are polished, the membrane becomes deteriorated. Thus, maintenance and/or replacement of the membrane is periodically performed. If the membrane after maintenance, or a new membrane is not properly attached to the head body of the polishing head, the gas leaks from the membrane, and thus it is impossible to press the plurality of zones of the substrate separately against polishing pad with the desired pressure. Accordingly, each time the membrane is attached to the head body, a leak checking of whether or not the leak of gas occurs from the membrane is performed.

Further, if the deteriorated membrane is broken down, the gas leaks from the membrane, and as a result, a polishing failure would occur in the substrate. When the polishing failure occurs, a worker of the polishing apparatus performs the leak checking for the membrane to check whether or not the gas leaks from the membrane.

In a conventional leak checking, the polishing head is removed from the polishing apparatus, and then this polishing head is fixed to a leak checking tool. Further, a compressed-gas supply source, which is provided as one of utilities in a factory, is connected to the leak-detection tool to supply the compressed gas into each pressure chamber formed by the membrane through the leak checking tool. The leak checking tool has a pressure sensor attached thereto, and the pressure chamber pressurized to a predetermined pressure is left for a predetermined time to check whether or not a measured value of the pressure sensor is lowered below an allowable value. If the measured value of the pressure sensor is below the allowable value, it is determined that the gas leaks from the membrane, and thus the membrane is reattached or replaced. This leak checking is performed for each of the plurality of pressure chambers in series. Performing of this leak checking prevents the gas from leaking from the membrane, so that polishing of the substrate can be appropriately carried out.

However, in the conventional leak checking, it is necessary to remove the polishing head from the polishing apparatus, and to attach this polishing head to the leak-detection tool. Accordingly, it takes much time and labor to perform this leak checking, and as a result, a downtime of the polishing apparatus is increased.

Further, the conventional leak checking detects only the leak of gas from the polishing head that is attached to the leak-detection tool. Therefore, the conventional leak checking cannot detect a leak of gas from a gas delivery line for supplying the compressed gas into each pressure chamber of the polishing head. As a result, even though the membrane is properly attached to the head body of the polishing head, the polishing failure would occur.

SUMMARY OF THE INVENTION

According to an embodiment, there is provided a leak checking method which is capable of detecting a leak of compressed gas supplied to a polishing head without removing the polishing head from a polishing apparatus. According to another embodiment, there is provided a computer-readable storage medium storing therein a program for performing such leak checking method.

Embodiments, which will be described below, relate to a leak checking method of detecting a leak of compressed gas from a polishing apparatus, and more particularly to a leak checking method of detecting a leak of compressed gas supplied to a substrate holder of a polishing apparatus. Further, the below-described embodiments relate to a computer-readable storage medium storing therein a program for performing the leak checking method.

In an embodiment, there is provided a leak checking method comprising: supplying a compressed gas into a pressure chamber, which is formed by a membrane of a polishing head, with the membrane placed in contact with a stationary surface; measuring flow rate of the compressed gas during supplying of the compressed gas into the pressure chamber, while regulating pressure of the compressed gas in the pressure chamber by use of a pressure regulator; measuring the pressure of the compressed gas in the pressure chamber; deciding whether or not the flow rate of the compressed gas measured when a variation in the pressure of the compressed gas is within an allowable range of variation, is within a reference range; and generating a leak-detection signal when the flow rate is outside of the reference range.

In an embodiment, deciding whether or not the flow rate of the compressed gas is within the reference range includes: deciding a point of time when the variation in the pressure of the compressed gas is within the allowable range of variation; and deciding whether or not the flow rate of compressed gas, which has been measured before reaching the point of time and measured in a predetermined time interval, is within the reference range.

In an embodiment, deciding whether or not the flow rate of the compressed gas is within the reference range includes: deciding a point of time when the variation in the pressure of the compressed gas is within the allowable range of variation; and deciding whether or not the flow rate of compressed gas, which is measured after reaching the point of time and measured in a predetermined time interval, is within the reference range.

In an embodiment, during performing of a calibration of the pressure regulator, it is determined whether or not the measured value of the flow rate is within the reference range.

In an embodiment, there is provided a non-transitory computer-readable storage medium storing therein a program for causing the computer to perform operations of: obtaining a measured value of flow rate of a compressed gas supplied into a pressure chamber, which is formed by a membrane of a polishing head, with the membrane placed in contact with the stationary surface; commanding a pressure regulator to cause the pressure regulator to perform an action for regulating a pressure of the compressed gas in the pressure chamber; obtaining a measured value of the pressure of the compressed gas in the pressure chamber; deciding whether or not the flow rate of the compressed gas measured when a variation in the pressure of the compressed gas is within an allowable range of variation, is within a reference range; and generating a leak-detection signal when the flow rate is outside of the reference range.

According to the above-described embodiments, the pressure sensor and the flowmeter of the polishing apparatus can be used to perform the leak checking of the compressed gas supplied to the polishing head of the polishing apparatus. Therefore, the leak checking can be automatically performed without removing the polishing head from the polishing apparatus. As a result, the burden of the worker who performs the leak checking and the downtime of the polishing apparatus can be reduced.

DESCRIPTION OF EMBODIMENTS

Embodiments will be described below with reference to the drawings.

Figure 1:
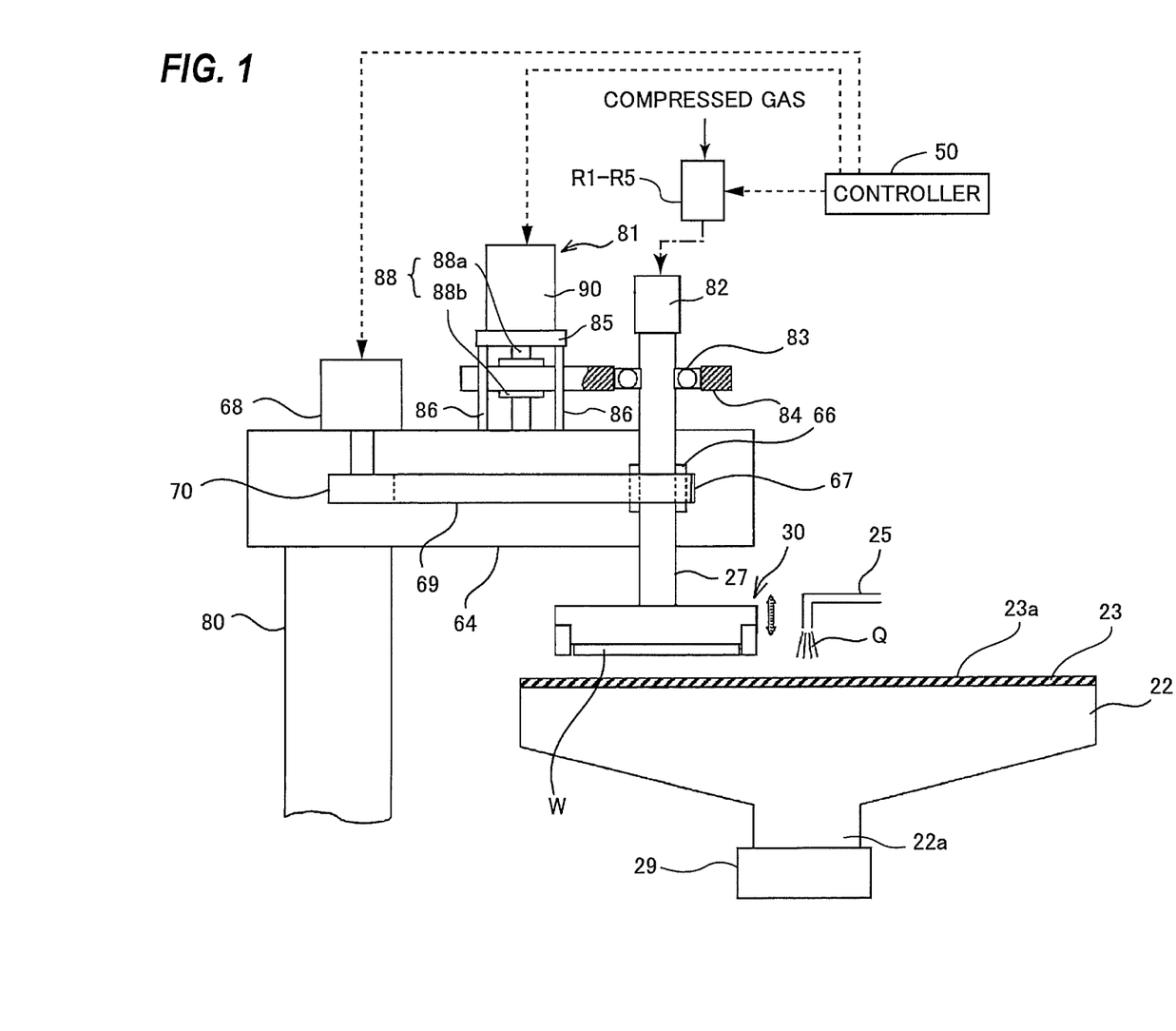
FIG. 1 is a view showing an embodiment of a polishing apparatus.

FIG. 1 is a view showing an embodiment of a polishing apparatus. As shown in FIG. 1, the polishing apparatus includes a polishing table 22 that supports a polishing pad 23, and a polishing head (i.e., a substrate holder) 30 for holding a substrate, such as wafer, as an object to be polished, and pressing the substrate against the polishing pad 23 on the polishing table 22.

The polishing table 22 is coupled through a table shaft 22a to a table motor 29 which is disposed below the polishing table 22, so that the polishing table 22 is rotatable about the table shaft 22a. The polishing pad 23 is attached to an upper surface of the polishing table 22. An upper surface of the polishing pad 23 serves as a polishing surface 23a for polishing the substrate W. A polishing-liquid supply nozzle 25 is provided above the polishing table 22 to supply a polishing liquid Q onto the polishing surface 23a of the polishing pad 23.

The polishing head 30 is connected to a polishing head shaft 27, which is vertically movable relative to a head arm 64 by a vertically moving mechanism 81. The vertical movement of the polishing head shaft 27 enables the entirety of the polishing head 30 to move upward and downward and enables positioning of the polishing head 30 with respect to the head arm 64. A rotary joint 82 is mounted to an upper end of the polishing head shaft 27.

The vertically moving mechanism 81 for vertically moving the polishing head shaft 27 and the polishing head 30 includes a bridge 84 rotatably supporting the polishing head shaft 27 through a bearing 83, a ball screw 88 mounted to the bridge 84, a support pedestal 85 supported by support posts 86, and a servomotor 90 mounted to the support pedestal 85. The support pedestal 85, which supports the servomotor 90, is fixedly mounted to the head arm 64 through the support posts 86.

The ball screw 88 includes a screw shaft 88a coupled to the servomotor 90 and a nut 88b that engages with the screw shaft 88a. The polishing head shaft 27 is vertically movable together with the bridge 84. When the servomotor 90 is set in motion, the bridge 84 moves vertically through the ball screw 88, so that the polishing head shaft 27 and the polishing head 30 move vertically.

The polishing head shaft 27 is coupled to a rotary sleeve 66 by a key (not shown). A timing pulley 67 is secured to a circumferential surface of the rotary sleeve 66. A polishing head motor 68 is fixed to the head arm 64. The timing pulley 67 is operatively coupled to a timing pulley 70, mounted to the polishing head motor 68, through a timing belt 69. When the polishing head motor 68 is set in motion, the rotary sleeve 66 and the polishing head shaft 27 are rotated together with each other through the timing pulley 70, the timing belt 69, and the timing pulley 67, thus rotating the polishing head 30. The head arm 64 is supported by a pivot shaft 80, which is rotatably supported by a frame (not shown). The polishing apparatus further includes a controller 50 for controlling devices including the polishing head motor 68 and the servomotor 90.

The polishing head 30 is configured to be able to hold the substrate W on its lower surface. The polishing head 30 and the head arm 64 is configured to be able to pivot on the pivot shaft 80. Thus, the polishing head 30, which holds the substrate W on its lower surface, is moved between a position at which the polishing head 30 receives the substrate W and a position above the polishing table 22 by a pivotal movement of the head arm 64.

Polishing of the substrate W is performed as follows. While the polishing head 30 and the polishing table 22 are rotated individually, the polishing liquid Q is supplied onto the polishing surface 23a of the polishing pad 23 from the polishing-liquid supply nozzle 25. In this state, the polishing head 30 is lowered to a predetermined position (i.e., a predetermined height), at which the polishing head 30 presses the substrate W against the polishing surface 23a of the polishing pad 23. The substrate W is placed in sliding contact with the polishing surface 23a of the polishing pad 23, so that a surface of the substrate W is polished. In one embodiment, slurry containing abrasive grains is used as the polishing liquid Q.

Figure 2:
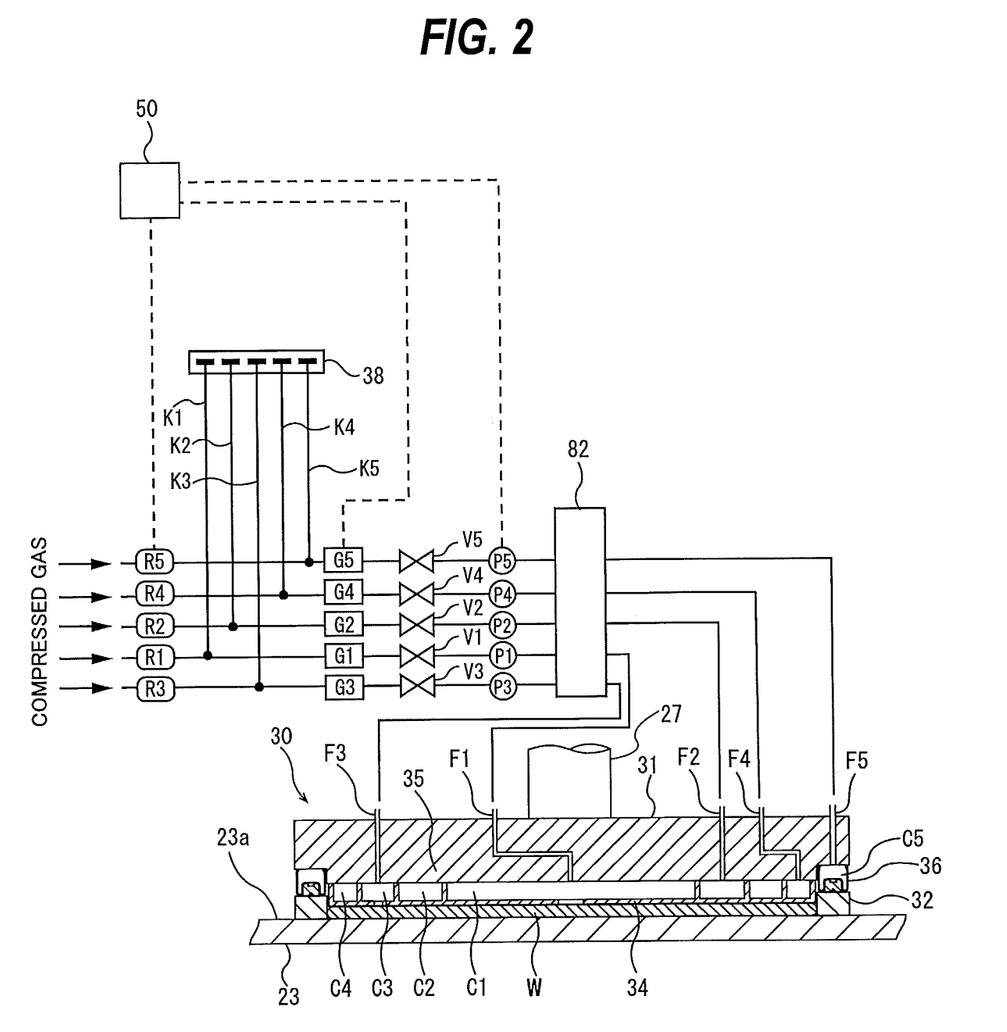
FIG. 2 is a cross-sectional view showing a polishing head arranged in the polishing apparatus shown in FIG. 1.

Next, the polishing head (i.e., substrate holder) 30 will be described below. FIG. 2 is a cross-sectional view showing the polishing head 30. The polishing head 30 includes a head body 31 fixed to an end of the polishing head shaft 27, a membrane (or an elastic membrane) 34 attached to a lower part of the head body 31, and a retainer ring 32 disposed below the head body 31. The retainer ring 32 is arranged around the membrane 34. The retainer ring 32 is an annular structure for retaining the substrate W so as to prevent the substrate W from being ejected from the polishing head 30 during polishing of the substrate W.

Four pressure chambers (or air-bags) C1, C2, C3, and C4 are provided between the membrane 34 and the head body 31. The pressure chambers C1, C2, C3, and C4 are formed by the membrane 34. The central pressure chamber C1 has a circular shape, and the other pressure chambers C2, C3, and C4 have an annular shape. These pressure chambers C1, C2, C3, and C4 are in a concentric arrangement.

Gas delivery lines F1, F2, F3, and F4 are coupled to the pressure chambers C1, C2, C3, and C4, respectively. One end of each of the gas delivery lines F1, F2, F3, and F4 is coupled to a compressed-gas supply source (not shown), which is provided as one of utilities in a factory that the polishing apparatus is installed. Compressed gases, such as compressed air, are supplied into the pressure chambers C1, C2, C3, and C4 through the gas delivery lines F1, F2, F3, and F4, respectively.

The gas delivery line F3, which communicates with the pressure chamber C3, is coupled to a vacuum line (not shown), so that a vacuum can be formed in the pressure chamber C3. The membrane 34 has an opening in a portion that forms the pressure chamber C3, so that the substrate W can be held by the polishing head 30 via vacuum suction by producing a vacuum in the pressure chamber C3. Further, the substrate W can be released from the polishing head 30 by supplying a compressed gas, such as compressed air, into the pressure chamber C3.

An annular membrane (or an annular rolling diaphragm) 36 is provided between the head body 31 and the retainer ring 32, and a pressure chamber C5 is formed in this membrane 36. The pressure chamber C5 communicates with said compressed-gas supply source through a gas delivery line F5. The compressed-gas supply source supplies the compressed gas into the pressure chamber C5, so that the pressure chamber C5 presses the retainer ring 32 against the polishing pad 23.

The gas delivery lines F1, F2, F3, F4, and F5, communicating with the pressure chambers C1, C2, C3, C4, and C5, respectively, are provided with pressure regulators R1, R2, R3, R4, and R5, respectively. The compressed gas from the compressed-gas supply source is supplied through the pressure regulators R1 to R5 into the pressure chambers C1 to C5, respectively and independently. The pressure regulators R1 to R5 are configured to regulate the pressures of the compressed gases in the pressure chambers C1 to C5.

The pressure regulators R1 to R4 can change independently the pressures in the pressure chambers C1 to C4 to thereby independently adjust the polishing pressures against corresponding four zones of the substrate W, i.e., a central zone; an inner intermediate zone; an outer intermediate zone; and an edge zone. The gas delivery lines F1, F2, F3, F4 and F5 are coupled to vent valves (not shown), respectively, so that the pressure chambers C1 to C5 can be ventilated to the atmosphere. The membrane 34 in this embodiment defines the four pressure chambers C1 to C4, while, in one embodiment, the membrane 34 may define less than four pressure chambers or more than four pressure chambers.

The pressure regulators R1 to R5 are coupled to a controller 50. The controller 50 is operable to send each target pressure value of the pressure chambers C1 to C5 to the pressure regulators R1 to R5 as a command value, and the pressure regulators R1 to R5 operate respectively such that the pressures in the pressure chambers C1 to C5 are maintained at corresponding target pressure values.

Flowmeter F1, F2, F3, F4, and F5 for measuring a flow rate of the compressed gas flowing into each gas delivery lines F1 to F5 are provided on the gas delivery lines F1 to F5, respectively. The gas delivery lines F1 to F5 extend from the pressure chambers C1 to C5 via the rotary joint 82 and the pressure regulators R1 to R5 to the afore-mentioned compressed-gas supply source.

Branch lines K1, K2, K3, K4, and K4 are connected to the gas delivery lines F1, F2, F3, F4, and F5, respectively. A multi-connection port 38 is mounted to tip portions of the branch lines K1 to K5. This multi-connection port 38 is openable and closable, and normally is closed.

On-off valves V1, V2, V3, V4, and V5 are provided on the gas delivery lines F1, F2, F3, F4, and F5, respectively. The on-off valves V1 to V5 are normally closed, and are opened during polishing of the substrate W. The flowmeters G1 to G5 are located between the pressure regulators R1 to R5 and the on-off valves V1 to V5, respectively. Further, pressure sensors P1, P2, P3, P4 and P5 for measuring a pressure of the compressed gas existing in each of the gas delivery lines F1, F2, F3, F4, and F5 are provided on the gas delivery lines F1, F2, F3, F4, and F5, respectively. Since the pressure sensors P1 to P5 communicate with the pressure chambers C1 to C5 through the gas delivery lines F1 to F5, respectively, the pressure sensors P1 to P5 can measure the pressures of the compressed gases in the pressure chambers C1 to C5, respectively. In this embodiment, the pressure sensors P1 to P5 are disposed at a secondary side (downstream side) of the on-off valves V1 to V5, respectively, i.e., disposed between the on-off valves V1 to V5 and the pressure chambers C1 to C5, respectively.

During polishing of the substrate W, the pressures of the compressed gases in the pressure chambers C1 to C5 are respectively maintained at the target pressure values by the pressure regulators R1 to R5. The membrane 34 can press different zones of the surface of the substrate W against the polishing surface 23a of the polishing pad 23 with different forces or the same force, enabling a polishing profile of the substrate W to be controlled.

The flowmeters G1 to G5 are coupled to the controller 50, and measured values of flow rates of the compressed gases flowing in the gas delivery lines F1 to F5 are sent from the flowmeter G1 to G5 to the controller 50. Similarly, the pressure sensors P1 to P5 are coupled to the controller 50, and measured values of the pressures of the compressed gases existing in the gas delivery lines F1 to F5 are sent from the pressure sensors P1 to P5 to the controller 50.

The controller 50 is configured to detect a leak of the compressed gas from the polishing apparatus based on changes in the measured value of the pressure of the compressed gas and in the measured value of the flow rate of the compressed gas. The leak checking is performed for each of the pressure chambers C1 to C5 in series. One embodiment of the leak checking for the pressure chamber C1 will be described below.

Figure 3:
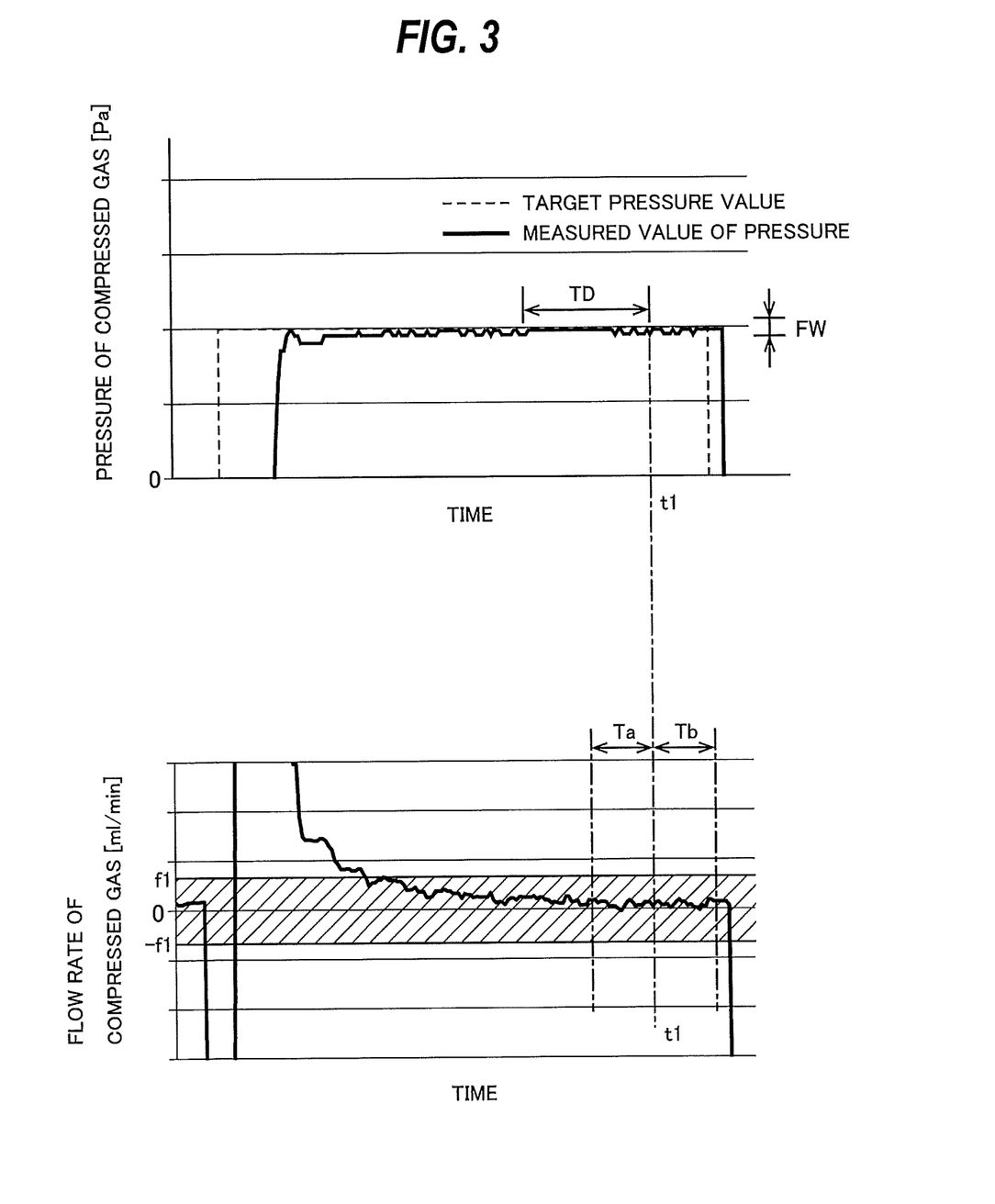
FIG. 3 is a graph showing an example of a change in pressure of a compressed gas in a pressure chamber, and a change in flow rate of the compressed gas flowing in a gas delivery line which communicates with the pressure chamber, in a case where there is no leak of the compressed gas.
Figure 4:
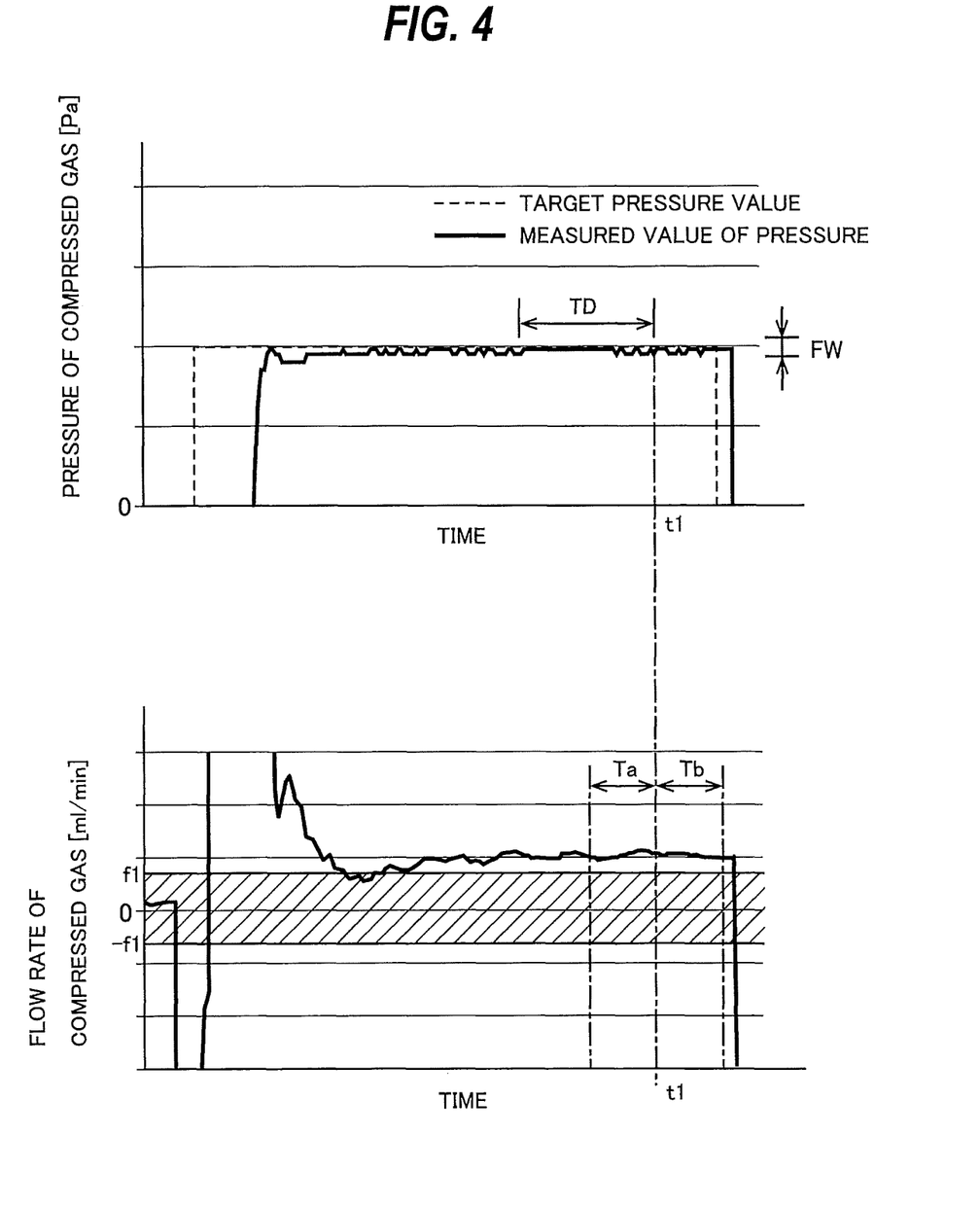
FIG. 4 is a graph showing an example of a change in pressure of the compressed gas in the pressure chamber, and a change in flow rate of the compressed gas flowing in the gas delivery line which communicates with the pressure chamber, in a case where there is leak of the compressed gas.

FIG. 3 is a graph showing an example of a change in pressure of the compressed gas in the pressure chamber C1, and a change in flow rate of the compressed gas flowing in the gas delivery line F1 which communicates with the pressure chamber C1, in a case where there is no leak of the compressed gas. FIG. 4 is a graph showing an example of a change in pressure of the compressed gas in the pressure chamber C1, and a change in flow rate of the compressed gas flowing in the gas delivery line F1 which communicates with the pressure chamber C1, in a case where there is leak of the compressed gas. The compressed gas is supplied into the pressure chamber C1 through the gas delivery line F1. The pressure regulator R1 is operated so as to maintain the pressure of the compressed gas in the pressure chamber C1 to the preset target pressure value. The pressure of the compressed gas in the pressure chamber C1 is measured by pressure sensor P1, and the flow rate of the compressed gas flowing in the gas delivery line F1 is measured by the flowmeter G1. The measured values of the pressure and the flow rate of the compressed gas are sent to the controller 50.

As shown in FIG. 3, although hunting of the pressure occurs in an initial stage in which the supply of the compressed gas into the pressure chamber C1 is stared, the pressure of the compressed gas gradually becomes stable over time. As the pressure becomes stable, the flow rate of the compressed gas is gradually lowered, and the flow rate eventually reaches almost zero. However, when a leak of the compressed gas occurs, as shown in FIG. 4, the flow rate of the compressed gas does not approach zero, though the pressure of the compressed gas becomes stable. Specifically, the flow rate does not reach zero as long as the leak of the compressed gas occurs, because the compressed gas having a flow rate corresponding to leak rate continues to flow in the gas delivery line F1.

Accordingly, in this embodiment, a leak checking is performed based on the pressure and the flow rate of the compressed gas. More specifically, during supplying of the compressed gas into the pressure chamber C1 through the pressure regulator R1, the flowmeter G1 measures the flow rate of the compressed gas, and the pressure sensor P1 measures the pressure of the compressed gas in the pressure chamber C1. The controller 50 is configured to decide whether or not the flow rate of the compressed gas measured when the pressure of the compressed gas is stable, is within a preset reference range (±f1). The controller 50 is configured to generate a leak-detection signal when the flow rate is outside of the reference range.

The controller 50 stores in advance an allowable range of variation for deciding whether or not the pressure of the compressed gas is stable. A symbol FW shown in FIG. 3 and FIG. 4 indicates the allowable range of variation. In one embodiment, a center of the allowable range of variation coincides with the target pressure value. The controller 50 is configured so as to detect the leak of compressed gas based on the flow rate that is measured when the variation in the pressure of the compressed gas is within the allowable range FW of variation, i.e., the pressure of compressed gas is stable.

The controller 50 decides a point t1 of time when the variation in the pressure of the compressed gas is within the allowable range FW of variation, and decides whether or not the flow rate of the compressed gas (i.e., the measured value of the flowmeter G1) during a predetermined time interval measured from the point t1 of time is within the preset reference range (±f1). In one embodiment, the controller 50 may measure an elapsed time when the variation in the pressure of the compressed gas is within the allowable range FW of variation, and decide a point of time at which the elapsed time exceeds a set time, as the point t1 of time.

In the example shown in FIG. 3 and FIG. 4, the point t1 of time is a point of time at which the elapsed time when the variation in the pressure of the compressed gas is within the allowable range FW of variation exceeds a set time TD. More specifically, the controller 50 stores in advance the set time TD, and measures an elapsed time when the variation in the pressure of the compressed gas is within the allowable range FW of variation, from the moment at which the pressure of compressed gas falls within the allowable range FW of variation. If the elapsed time when the variation in the pressure of the compressed gas is within the allowable range FW of variation exceeds the set time TD, the controller 50 decides a point of time at which the elapsed time has just exceeded the set time TD, as the point t1 of time. If, before said elapsed time reaches the set time TD, the variation in the pressure of the compressed gas exceeds the allowable range FW of variation, the controller 50 interrupts measurement of the elapsed time. When the variation in the pressure of the compressed gas falls within the allowable range FW of variation again, the controller 50 starts the measurement of the elapsed time.

Although not shown, the controller 50 may store in advance a maximum monitoring time for monitoring the variation in the pressure of the compressed gas. In this case, the controller 50 measures a gas-supply time to supply the compressed gas into the pressure chamber C1. If the gas-supply time reaches the maximum monitoring time while the elapsed time when the variation in the pressure of the compressed gas is within the allowable range FW of variation does not reach the set time TD, the controller 50 decides a point of time that has just reached the maximum monitoring time, as the point t1 of time.

In this manner, in the example shown in FIG. 3 and FIG. 4, the controller 50 decides the point t1 of time when the variation in the pressure of the compressed gas is within the allowable range FW of variation. Further, the controller 50 is configured to decide whether or not the flow rate of the compressed gas, which has been measured before reaching this point t1 of time and measured in a predetermined time interval Ta, is within the reference range. In this embodiment, the time interval Ta is shorter than said set time TD. However, the time interval Ta may be equal to the set time TD. According to this embodiment, the flow rate measured before reaching the point t1 of time is used for the leak checking. Therefore, immediately after reaching the point P1 of time, the controller 50 can decide whether or not the leak-detection signal is generated (i.e., the leak of the compressed gas occurs or not), based on the measured value of the flow rate that has been already obtained from the flowmeter G1.

In one embodiment, the controller 50 may be configured to decide the point t1 of time when the variation in the pressure of the compressed gas is within the allowable range FW of variation, and decide whether or not the flow rate of compressed gas, which is measured after reaching the point t1 of time and measured in a predetermined time interval Tb, is within the reference range. In the example shown in FIG. 3 and FIG. 4, the time interval Tb is shorter than said set time TD. However, the time interval Tb may be equal to the set time TD.

Figure 5:
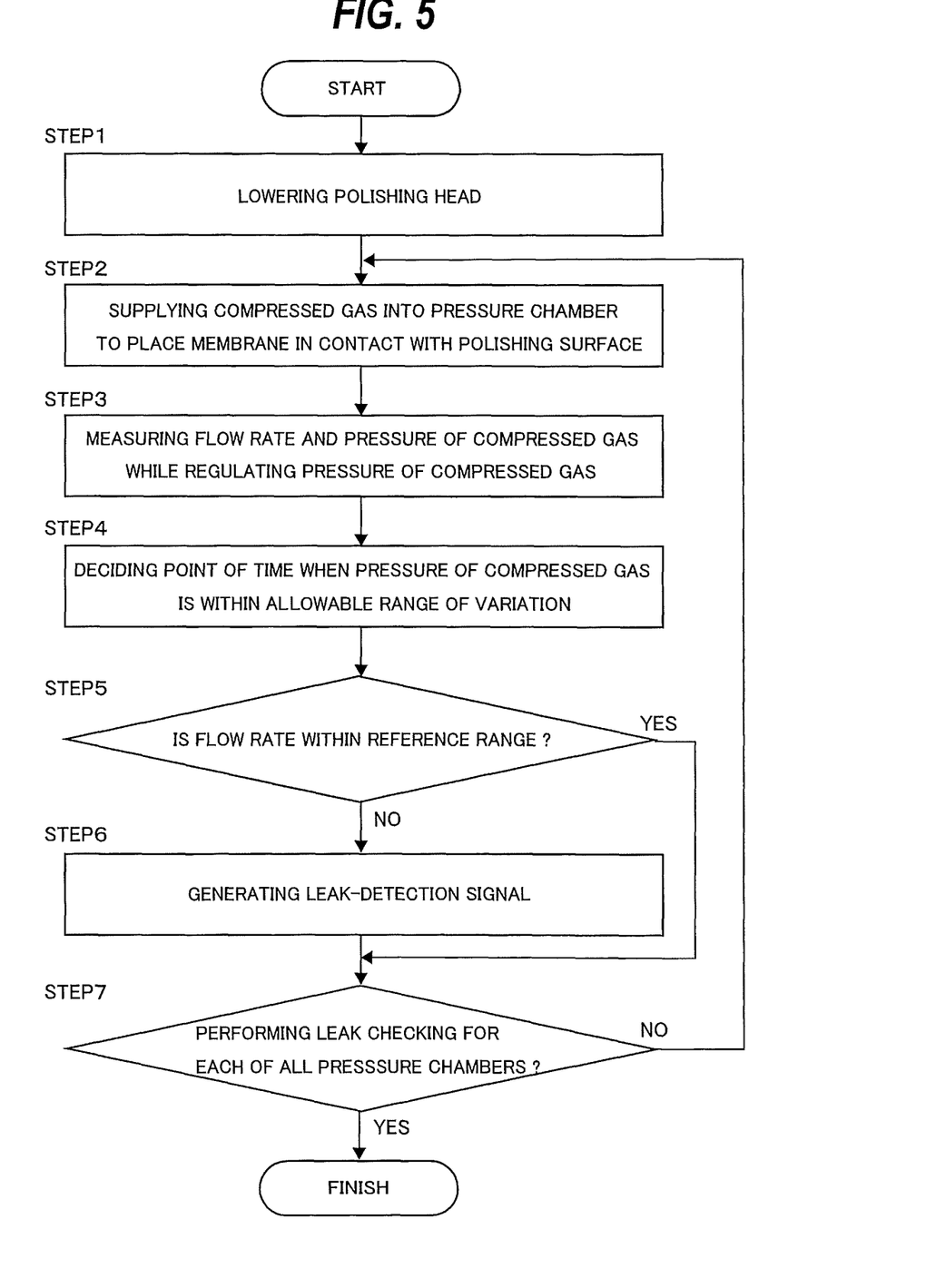
FIG. 5 is a flowchart illustrating a leak checking method according to an embodiment.

Next, an embodiment of the leak checking method will be described below with reference to a flowchart shown in FIG. 5. FIG. 5 is a flowchart illustrating a leak checking method according to an embodiment. During performing of the leak checking, the polishing table 34 is not rotated. In step 1, the controller 50 commands the vertically moving mechanism 81 shown in FIG. 1 to lower the polishing head 30. The polishing head 30 may be lowered until the retainer ring 32 contacts the polishing surface 23a.

In step 2, the controller 50 opens the on-off valve V1 and closes the on-off valves V2 to V5 to thereby start the supply of the compressed gas into the pressure chamber C1 through the gas delivery line F1. The compressed gas in the pressure chamber C1 inflates the membrane 34 to place the membrane 34 in contact with the polishing surface 23a. In a state where the polishing table 34 is not rotated, the polishing surface 23a of the polishing pad 23 serves as a stationary surface. The purpose of placing the membrane 34 in contact with the stationary surface is to close the opening formed in a lower surface of the membrane 34, and to stabilize a volume of the pressure chamber filled with the compressed gas. The stationary surface is not limited particularly so long as it is a flat surface and a surface whose height is fixed. For example, the stationary surface may be an upper surface of a plate which is placed on the polishing pad 23 or the polishing table 34, or an upper surface of a plate which is disposed beside the polishing table 34.

In step 3, during supplying of the compressed gas into the pressure chamber C1 through the gas delivery line F1, the flowmeter G1 measures the flow rate of the compressed gas flowing in the gas delivery line F1, and the pressure regulator R1 regulates the pressure of the compressed gas so as to maintain the pressure of the compressed gas in the pressure chamber C1 to the target pressure value. The measured value of the flow rate is sent to the controller 50, and is stored in a memory of the controller 50. During supplying of the compressed gas into the pressure chamber C1, the pressure sensor P1 measures the pressure of the compressed gas in the gas delivery line F1 (i.e., the pressure in the pressure chamber C1). The measured value of the pressure is sent to the controller 50, and is stored in the memory of the controller 50. During supplying of the compressed gas into the pressure chamber C1, the controller 50 monitors the measured values of the flow rate and the measured values of the pressure.

In step 4, the controller 50 decides the point t1 of time when the variation in the pressure of the compressed gas is within the allowable range FW of variation (i.e., the point of time when the pressure of the compressed gas in the pressure chamber C1 is stable). In step 5, the controller 50 decides whether or not the flow rate, which has been measured before reaching the decided point t1 of time and measured in the predetermined time interval Ta, is within the reference range. Alternatively, the controller 50 may decide whether or not the flow rate, which is measured after reaching the decided point t1 of time and measured in the predetermined time interval Tb, is within the reference range. If the flow rate is outside of the reference range, the controller 50 generates the leak-detection signal (see step 6). The leak-detection signal may serve as a trigger signal for emitting an alarm. For example, the leak-detection signal may be an electrical signal for indicating the leak-detection on a display device, or for setting an alarm device in motion.

After the leak-detection signal is generated, or in a case where the flow rate is within the reference range, the controller 50 performs step 7. In step 7, the controller 50 decides whether or not the leak checking for each of all pressure chambers C1 to C5 is performed. The controller 50 repeats step 2 to step 6 until the leak checking for each of all pressure chambers C1 to C5 is performed. For example, in a case where the leak checking for the pressure chamber C2 is performed, the controller 50 opens the on-off valve V2, and closes the on-off valves V1, V3 to V5. The operations of step 3 to step 6 are performed in the same way.

According to this embodiment, the pressure sensors P1 to P5 and the flowmeters G1 to G5 provided in the polishing apparatus can be used to perform the leak checking of the compressed gas supplied to the polishing head (substrate holder) 30 of the polishing apparatus. Therefore, the leak checking can be automatically performed without removing the polishing head 30 from the polishing apparatus. As a result, the burden of the worker who performs the leak checking and the downtime of the polishing apparatus can be reduced.

Such leak checking is preferably performed after replacing components, such as the membrane 34 and the pressure regulators R1 to R5, which contact the compressed gas. The leak checking according to this embodiment enables the leak of gas occurring between the compressed-gas supply source and each pressure chamber C1 to C5 to be detected. Therefore, the leak of the compressed gas from the components, such as the pressure regulators R1 to R5, which contact the compressed gas, can be detected. Further, when polishing failure occurs, the above-described leak checking may be performed. This leak checking can be easily performed in a short period of time regardless of experiences and skills of the worker, because the leak checking can be automatically performed without removing the polishing head 30 from the polishing apparatus.

Further, this leak checking may be performed during calibrations of the pressure regulators R1 to R5. The calibrations of the pressure regulators R1 to R5 will be described below.

Figure 6:
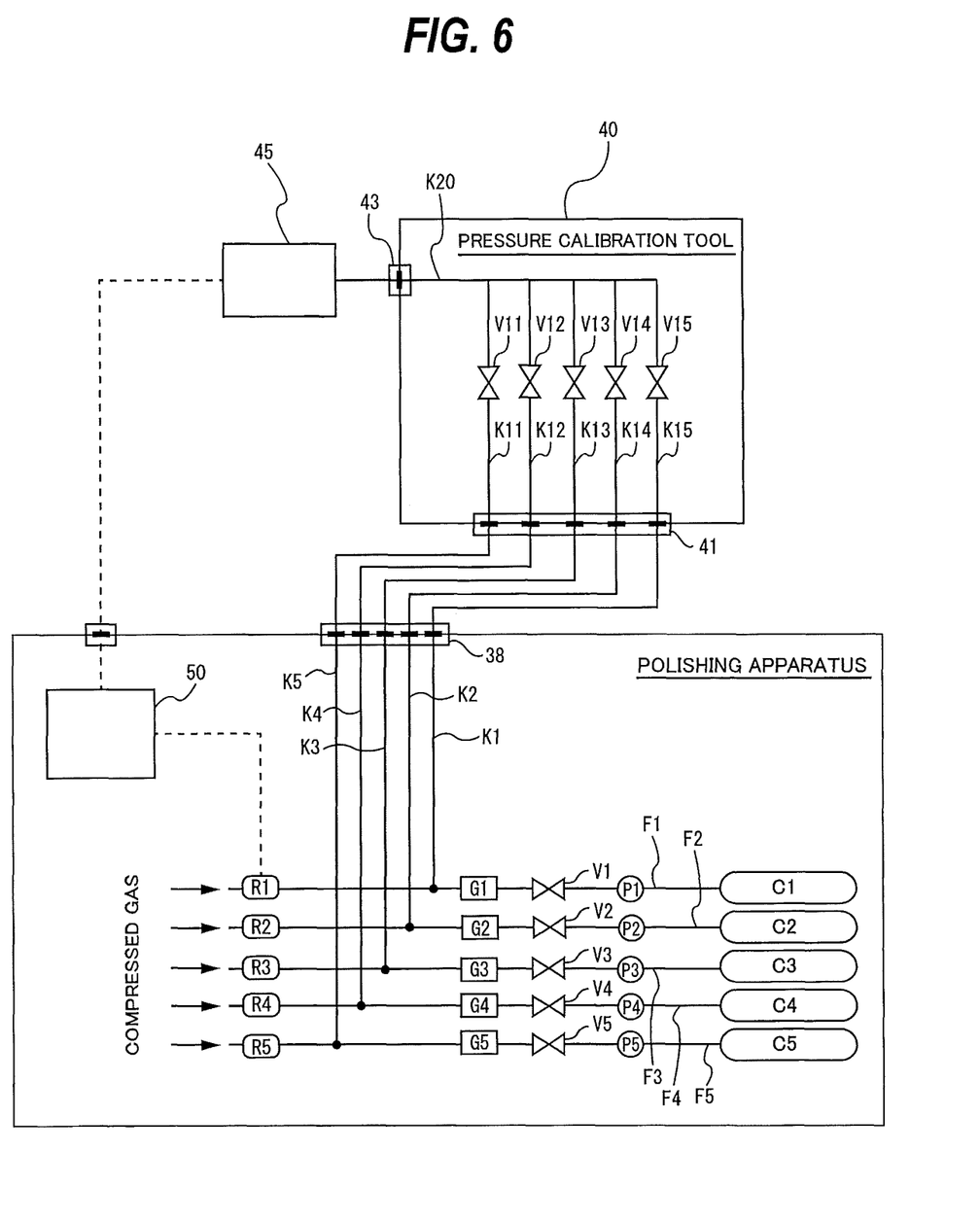
FIG. 6 is a schematic view showing an example of a pressure-calibration tool, and a structure of a polishing apparatus to which the pressure-calibration tool is coupled.

The calibrations of the pressure regulators R1 to R5 are performed with use of a pressure-calibration tool 40 shown in FIG. 6. FIG. 6 is a schematic view showing an example of a pressure-calibration tool 40, and a structure of a polishing apparatus to which this pressure-calibration tool 40 is coupled. As shown in FIG. 6, the pressure-calibration tool 40 includes a multi-connection port 41, a plurality of first passage pipes K11 to K15 which are connected to the multi-connection port 41, a plurality of on-off valves V11 to V15 which are respectively provided on these first passage pipes K11 to K15, a second passage pipe K20 which is connected to the first passage pipes K11 to K15, and a connector 43 which is mounted on an end of the second passage pipe K20. When the calibrations of the pressure regulators R1 to R5 are performed, a master-pressure sensor 45 is connected to the connector 43.

The master-pressure sensor 45 is a highly-accurate sensor, which has been calibrated. The master-pressure sensor 45 is electrically connected to the controller 50, and thus the measured value of pressure measured by the master-pressure sensor 45 is sent to the controller 50. The plurality of first passage pipe K11 to K15 are respectively coupled to the gas delivery lines F1 to F5 through the multi-connection port 38 of the polishing apparatus and the multi-connection port 41 of the pressure calibration tool 40.

The on-off valves V1 to V5 and the corresponding on-off valves V11 to V15 of the pressure calibration tool 40 are configured so as to operate synchronously with each other. For example, when the on-off valve V1 is opened, the corresponding on-off valve V11 of the pressure calibration tool 40 also is opened synchronously, and when the on-off valve V2 is opened, the corresponding on-off valve V12 of the pressure calibration tool 40 also is opened synchronously. The on-off valves V1 to V5, and the on-off valves V11 to V15 are configured as air operated valve, motor operated valve, or solenoid operated valve.

The calibration of the pressure regulator R1 is performed as follows. First, the controller 50 commands the vertical moving mechanism 81 to lower the polishing head 30. This operation corresponds to step 1 shown in FIG. 5. Next, the controller 50 opens the on-off valve V1, and maintains the on-off valves V2 to V5 in a closed condition. This operation causes the supply of the compressed gas into the pressure chamber C1 to be started, so that the membrane 34 is placed in contact with the polishing surface 23a of the polishing pad 23. This operation corresponds to step 2 shown in FIG. 5.

The on-off valve 11 of the pressure-calibration tool 40 is opened synchronously with this operation of the on-off valve V1. The on-off valves V12 to V15 are maintained in a closed condition. The controller 50 sends to the pressure regulator R1 a command value (i.e., the target pressure value) with which the pressure of the compressed gas in the pressure chamber C1 becomes a predetermined pressure (e.g., 25 hPa), and the pressure regulator R1 operates, based on the received command value, to maintain the pressure of the compressed gas in the pressure chamber C1 to the target pressure value that is the command value. At this time, the controller 50 obtains the measured value of the pressure from the pressure sensor P1, and obtains the measured value of the flow rate from the flowmeter G1. This operation corresponds to step 3 shown in FIG. 5.

The compressed gas passing through the pressure regulator R1 flows into the first passage pipe K11 and the second passage pipe K20 of the pressure calibration tool 40. The master-pressure sensor 45 measures a pressure of the compressed gas flowing in the second passage pipe K20, and sends the measured value of the pressure to the controller 50.

The controller 50 maintains the on-off valves V2 to V5 and the on-off valves V12 to V15 in the closed condition, so that the master-pressure sensor 45 can measure only the pressure in the pressure chamber C1. The measured value of the pressure measured by the master-pressure sensor 45 is fed back to the controller 50.

The controller 50 performs afore-mentioned operations with different pressures (for example, 100 hPa, and 200 hPa) in the same manner, and performs corrections for the command values that are sent from the controller 50 to the pressure regulator R1, based on the measured values of the pressure which are fed back from the master pressure sensor 45. Specifically, if the measured value of the pressure is high relative to the command value, the command value is corrected such that the command value becomes smaller, and if the measured value of the pressure is low relative to the command value, the command value is corrected such that the command value becomes larger. If the measured value of the pressure is equal to the command value, the correction for the command value is not performed.

During performing of the calibration of the pressure regulator R1, the controller 50 decides the point t1 of time when the pressure of the compressed gas in the pressure chamber C1 is stable (i.e., the point of time when the measured value of the pressure sensor P1 is within the allowable range FW of variation). This operation corresponds to step 4 shown in FIG. 5. Further, during performing of the calibration of the pressure regulator R1, the controller 50 monitors the measured value of the flow rate sent from the flowmeter G1, and decides whether or not the measured value of the flow rate is within the reference range (±f1) by going back from the point t1 of time by the predetermined time interval Ta. This operation corresponds to step 5 shown in FIG. 5. When the measured value of the flow rate is outside of the reference range (±f1), the controller 50 generates the leak-detection signal. This operation corresponds to step 6 shown in FIG. 6.

After finishing the leak checking and the calibration of the pressure regulator R1, the controller 50 performs the leak checking and the calibration of each of other pressure regulators R2 to R5 in the same manner. This operations corresponds to step 7 shown in FIG. 5.

The calibrations of the pressure regulator R1 are performed with the plurality of pressures (in the above-described example, 25 hPa, 100 hPa, and 200 hPa). The leak checking may be performed with one or more pressures which are selected from the plurality of pressures to perform the calibration, or may be performed with all pressures to perform the calibration. Accordingly, the leak checking is performed with at least one pressure selected from the plurality of pressures to perform the calibration.

In this manner, the leak checking of the compressed gas supplied to the polishing apparatus can be performed at the same time as the calibrations of the pressure regulators R1 to R5. Therefore, according to the leak checking method of this embodiment, two processes (i.e., the calibrations of the pressure regulators R1 to R5, and the leak checking) can be completed at the same time, so that the burden of the worker and the downtime of the polishing apparatus can be reduced.

After finishing the calibrations of all pressure regulators R1 to R5, the controller 50 performs calibrations of the measured values of pressures that are sent from the pressure sensors P1 to P5, which are provided in the polishing apparatus, to the controller 50.

More specifically, the controller 50 sends to the calibrated pressure regulator R1 a command value (i.e., the target pressure value) with which the pressure in the pressure chamber C1 becomes a predetermined pressure (e.g., 25 hPa), and the pressure regulator R1 applies pressure on the pressure chamber C1, based on the received command value. The pressure in the pressure chamber C1 is measured by the pressure sensor P1, and the measured value of the pressure measured by the pressure sensor P1 is fed back to the controller 50.

The controller 50 performs afore-mentioned operations with different pressures (for example, 100 hPa, 200 hPa) in the same manner, and performs correction for the measured value of the pressure that is sent from the pressure sensor P1 to the controller 50, based on the command value which is sent from the controller 50 to the pressure regulator R1. Specifically, if the measured value of the pressure is high relative to the command value, the measured value of the pressure is corrected such that the measured value of the pressure becomes smaller, and if the measured value of the pressure is low relative to the command value, the measured value of the pressure is corrected such that the measured value of the pressure becomes larger. If the measured value of the pressure is equal to the command value, the correction for the measured value of the pressure is not performed.

After finishing the calibration of the pressure sensor P1, the controller 50 performs the calibrations of other pressure sensors P2 to P5 in the same manner.

During performing of the calibrations of the pressure sensors P1 to P5, the above-described leak checking may be performed. Specifically, when the calibration of the pressure sensor P1 is performed, the controller 50 obtains, while supplying the compressed gas into the pressure chamber C1 (see step 2 in FIG. 5), the measured value of the pressure from the pressure sensor P1 and the measured value of the flow rate from the flowmeter G1 (see step 3 in FIG. 5). Further, the controller 50 decides the point t1 of time when the pressure in the pressure chamber C1 is stable (see step 4 in FIG. 5).

Further, the controller 50 decides whether or not the measured value of the flow rate is within the reference range (±f1) by going back from the point t1 of time by the predetermined time interval Ta (see step 5 in FIG. 5). When the measured value of the flow rate is outside of the reference range (±f1), the controller 50 generates the leak-detection signal (see step 6 in FIG. 5).

After finishing the calibration of the pressure sensor P1, the controller 50 performs the calibrations of other pressure sensors P2 to P4 in the same manner. During performing of the calibrations of other pressure sensors P2 to P4, the leak checking for each of the pressure chambers C2 to C4 is performed (see step 7 in FIG. 5). In this manner, the leak checking of the compressed gas supplied to the polishing apparatus can be performed at the same time as the calibrations of the pressure sensors P1 to P5.

Figure 7:
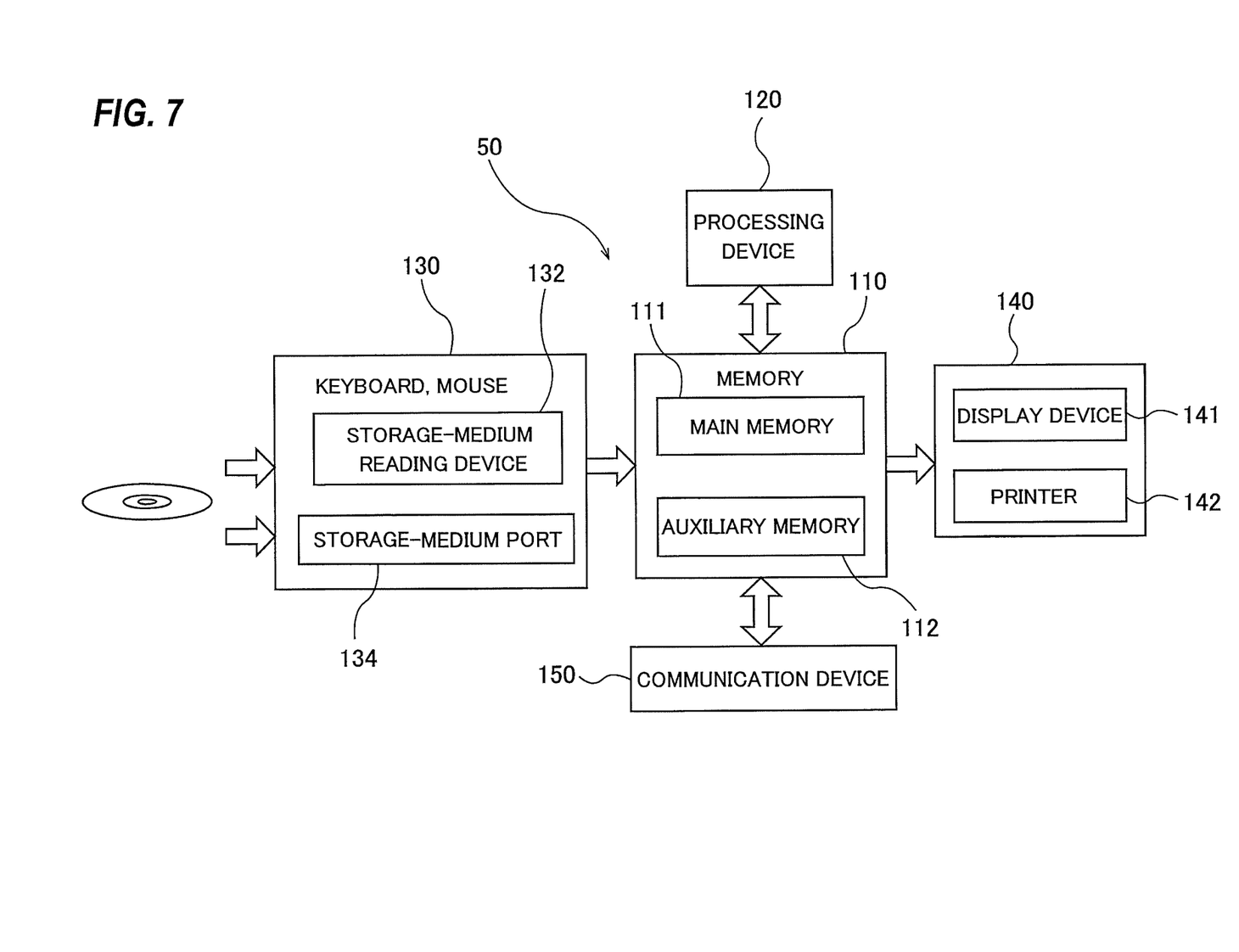
FIG. 7 is a schematic view showing a structure of a controller.

The operations of the polishing apparatus are controlled by the controller 50. In this embodiment, the controller 50 is constituted by a dedicated computer or a general-purpose computer. FIG. 7 is a schematic view showing an example of a structure of the controller 50. The controller 50 includes a memory 110 in which a program and data are stored, a processing device 120, such as CPU (central processing unit), for performing arithmetic operation according to the program stored in the memory 110, an input device 130 for inputting the data, the program, and various information into the memory 110, an output device 140 for outputting processing results and processed data, and a communication device 150 for connecting to a network, such as the Internet.

The memory 110 includes a main memory 111 which is accessible by the processing device 120, and an auxiliary memory 112 that stores the data and the program therein. The main memory 111 may be a random-access memory (RAM), and the auxiliary memory 112 is a storage device which may be a hard disk drive (HDD) or a solid-state drive (SSD).

The input device 130 includes a keyboard and a mouse, and further includes a storage-medium reading device 132 for reading the data from a storage medium, and a storage-medium port 134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 132 include optical disk drive (e.g., CD drive, DVD drive) and card reader. Examples of the storage-medium port 134 include USB terminal. The program and/or the data stored in the storage medium is introduced into the controller 50 via the input device 130, and is stored in the auxiliary memory 112 of the memory 110. The output device 140 includes a display device 141 and a printer 142.

The controller 50 operates according to the program electrically stored in the memory 110. Specifically, the controller 50 performs operations of: commanding the vertical moving mechanism 81 to perform an action for lowering the polishing head 30; obtaining the measured value of the flow rate of the compressed gas supplied into each of the pressure chambers C1 to C5 formed by the membrane 34, with the membrane 34 of the polishing head 30 placed in contact with the stationary surface; commanding each of the pressure regulators R1 to R5 to cause the pressure regulators R1 to R5 to perform an action for regulating the pressure in each of the pressure chambers C1 to C5; obtaining the measured value of the pressure of the compressed gas in each of the pressure chambers C1 to C5; deciding whether or not the flow rate of the compressed gas measured when the variation in the pressure of the compressed gas is within the allowable range of variation, is within the reference range; and deciding that the leak of the compressed gas occurs, when the flow rate is outside of the reference range.

The program for causing the controller 50 to perform these operations is stored in a non-transitory tangible computer-readable storage medium. The controller 50 is provided with the program via the storage medium. The controller 50 may be provided with the program via communication network, such as the Internet.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:
1. A leak checking method comprising:
supplying a compressed gas into a pressure chamber, which is forming by a membrane of a polishing head, with the membrane placed in contact with a stationary surface;
measuring flow rate of the compressed gas during supplying of the compressed gas into the pressure chamber, while regulating pressure of the compressed gas in the pressure chamber by use of a pressure regulator;
measuring the pressure of the compressed gas in the pressure chamber;

deciding whether or not the flow rate of the compressed gas measured when a variation in the pressure of the compressed gas is within an allowable range of variation, is within a reference range; and generating a leak-detection signal when the flow rate is outside of the reference range.

2. The leak checking method according to claim 1, wherein deciding whether or not the flow rate of the compressed gas is within the reference range includes:

deciding a point of time when the variation in the pressure of the compressed gas is within the allowable range of variation; and deciding whether or not the flow rate of compressed gas, which has been measured before reaching the point of time and measured in a predetermined time interval, is within the reference range.

3. The leak checking method according to claim 1, wherein deciding whether or not the flow rate of the compressed gas is within the reference range includes:

deciding a point of time when the variation in the pressure of the compressed gas is within the allowable range of variation; and deciding whether or not the flow rate of compressed gas, which is measured after reaching the point of time and measured in a predetermined time interval, is within the reference range.

4. The leak checking method according to claim 1, wherein during performing of a calibration of the pressure regulator, it is determined whether or not the measured value of the flow rate is within the reference range.

5. A non-transitory computer-readable storage medium storing therein a program for causing the computer to perform operations of:

obtaining a measured value of flow rate of a compressed gas supplied into a pressure chamber, which is formed by a membrane of a polishing head, with the membrane placed in contact with the stationary surface;

commanding a pressure regulator to cause the pressure regulator to perform an action for regulating a pressure of the compressed gas in the pressure chamber;

obtaining a measured value of the pressure of the compressed gas in the pressure chamber;

deciding whether or not the flow rate of the compressed gas measured when a variation in the pressure of the compressed gas is within an allowable range of variation, is within a reference range; and generating a leak-detection signal when the flow rate is outside of the reference range.

* * * * *